United States Patent [19]
Tsushima et al.

[11] Patent Number: 5,863,679
[45] Date of Patent: Jan. 26, 1999

[54] METHOD FOR FORMING THIN FILM PATTERN

[75] Inventors: Hiroshi Tsushima, Takatsuki; Iwao Sumiyoshi, Osaka; Masaaki Yokoyama, Toyonaka, all of Japan

[73] Assignee: Nippon Paint Co., Ltd., Osaka, Japan

[21] Appl. No.: 675,839

[22] Filed: Jul. 5, 1996

Related U.S. Application Data

[63] Continuation of Ser. No. 311,926, Sep. 26, 1994, abandoned.

[30] Foreign Application Priority Data

Sep. 27, 1993 [JP] Japan .................................. 5-239671

[51] Int. Cl.$^6$ .............................. G08C 11/00; B05D 5/00
[52] U.S. Cl. ................................ 430/14; 430/17; 430/18; 430/198; 430/325; 427/64; 427/162; 427/165; 427/226; 427/261; 427/265; 427/266; 427/287; 427/407.1; 427/419.2; 427/510; 427/515; 427/145
[58] Field of Search ..................... 427/510, 515, 427/419.2, 407.1, 287, 261, 265, 266, 145, 64, 162, 165, 226; 430/14, 17, 18, 198, 325

[56] References Cited

U.S. PATENT DOCUMENTS

| | | | |
|---|---|---|---|
| 4,715,929 | 12/1987 | Ogawa | 427/510 |
| 5,021,398 | 6/1991 | Sharma | 427/510 |
| 5,077,085 | 12/1991 | Schnur | 427/510 |

FOREIGN PATENT DOCUMENTS 0552035  7/1993  European Pat. Off. .

*Primary Examiner*—Janyce Bell
*Attorney, Agent, or Firm*—Wenderoth, Lind and Ponack L.L.P.

[57] ABSTRACT

The present invention provides a method for forming a thin film pattern having an excellent accuracy of the pattern. The method comprises the steps of:

(a) exposing a polysilane layer formed from a polysilane having a structure of the formula:

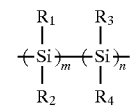

wherein $R_1$, $R_2$, $R_3$ and $R_4$ indicate a group which is independently selected from the group consisting of a substituted or non-substituted aliphatic hydrocarbon residue, an alicyclic hydrocarbon residue and an aromatic hydrocarbon residue and m and n indicate an integer, provided on a substrate, to ultraviolet light selectively to form a latent image of the thin film pattern; and (b) dipping the polysilane layer in which the latent image of the thin film pattern is formed in a metal oxide sol and then drying.

10 Claims, 1 Drawing Sheet

METHOD FOR FORMING THIN FILM PATTERN

This application is a continuation of now abandoned Ser. No. 08/311,926 filed Sep. 26, 1994, now abandoned.

FIELD OF THE INVENTION

The present invention relates to a method for forming a thin film pattern on a substrate. More particularly, it relates to a method for patterning a functional ceramic thin film formed by means of a sol-gel processing.

BACKGROUND OF THE INVENTION

A method for synthesizing a ceramic thin film using a solution reaction (referred to as a "sol-gel processing") has attracted special interest recently. The sol-gel processing is a method comprising synthesizing an inorganic polymer precursor from an organic metal compound or a metal complex in a solution by using a hydrolysis reaction or condensation reaction; applying the solution on a substrate by means of a spray method, dipping method or spin-coating method to form a thin film; and subjecting the thin film to a heat treatment to form a functional ceramic thin film. The functional ceramic thin film is used as dielectric film, insulator film, protective film, etc. in electronic devices such as thin film capacitor, LSI, electroluminescent device and the like, and a formation technique by means of the sol-gel processing have been studied intensively. On the other hand, in addition to the above electronic devices, the sol-gel processing is applied for a surface treatment of functional glass or plastic, for example, anti-diffusion film of alkali, interference colored film, anti-reflection film, reflection film and the like.

The method for forming a thin film by means of the sol-gel processing has excellent characteristics such as temperature reduction of process temperature, freedom of composition, formation of uniform thin film on a substrate having a large surface area and the like.

However, there is no method of patterning a thin film, and a method of removing a thin film by conducting etching after formation of the thin film is popular. A complicated lithography step using a photoresist is required in order to conduct etching, and simplification of the step has been required.

Further, it has been studied to use a glass as the substrate for magneto-optic disc in view of durability, however, it's practical application is falling behind because of the largest disadvantage of the glass, i.e. a pre-groove can not be formed at low cost. For example, as the practical application of the sol-gel processing, there have been proposed a method of transferring a groove by a stamper while the gel is soft (Tohge et al., J. Am. Cream. Soc. 70, C13 (1987)) and RIE (Reactive Ion Etching) method wherein a photolithography method is combined with a dry-etching method after a $SiO_2$ film was formed (Ota et al., Electronic Material, 27, 7, 57 (1988)). However, they are merely used for long-term storage in view of cost.

On the other hand, the present inventors have already proposed a process for dyeing a pattern using a silanol group produced by exposing an organic polysilane to ultraviolet light (Japanese Laid-Open Patent Publication No. 05-188215) and a method for coloring a pattern by dipping in a colored sol solution comprising a metal alkoxide containing a dye or a pigment as a raw material (Japanese Patent Application No. 4-68243). Further, the present inventors have studied to develop a function other than a colored pattern using a sol.

As described above, the present inventors have studied intensively. As a result, the present invention has been accomplished.

SUMMARY OF THE INVENTION

The main object of the present invention is to provide a method for forming a thin film pattern having excellent accuracy of the pattern, which improves a method for forming a thin film by means of the sol-gel processing and which enables manufacturing at low cost.

This object as well as other objects and advantages of the present invention will become apparent to those skilled in the art from the following description with reference to the accompanying drawings.

The present invention provides a method for forming a thin film pattern, which comprises the steps of:

(a) exposing a polysilane layer formed from polysilane having a structure of the formula:

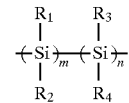

wherein $R_1$, $R_2$, $R_3$ and $R_4$ indicate a group which is independently selected from the group consisting of a substituted or non-substituted aliphatic hydrocarbon residue, an alicyclic hydrocarbon residue and an aromatic hydrocarbon residue and m and n indicate an integer, provided on a substrate, to ultraviolet light selectively to form a latent image of the thin film pattern; and (b) dipping the polysilane layer in which the latent image of the thin film pattern was formed in a metal oxide sol and then drying.

Preferably, this method further comprises the step of removing the part other than the ultraviolet light-exposed part of the polysilane layer, after the thin film pattern was formed.

DETAILED DESCRIPTION OF THE INVENTION

In the present specification, the term "metal oxide sol" used herein means those which are prepared by subjecting one or more sorts of metals to condensation polymerization through oxygen and solating in a suitable solvent. For example, in case of silicon, the resulting sol is referred to as a silica sol.

Polysilane used in the present invention is a polysilane having a structure of the formula:

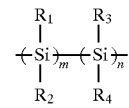

wherein $R_1$, $R_2$, $R_3$ and $R_4$ indicate a group which is independently selected from the group consisting of a substituted or non-substituted aliphatic hydrocarbon residue such as methyl group, n-propyl group, n-butyl group, n-hexyl group, phenylmethyl group, trifluoropropyl group and nonafluorohexyl group, an aromatic hydrocarbon residue such as p-tolyl group, biphenyl group and phenyl group and a substituted or non-substituted alicyclic hydrocarbon residue such as cyclohexyl group and methylcyclohexyl group; and m and n indicate an integer. In case of the aliphatic or alicyclic hydrocarbon, the number of carbon atoms is 1 to 10. In case of the aromatic hydrocarbon, a kind of the substituents $R_1$ to $R_4$ having 6 to 14 carbon atoms and the value of m and n are not particularly important and this polysilane resin may have organic solvent-solubility and can be coated to form an uniform film (film thickness of 0.1 to 10 $\mu$m).

According to the method for forming a thin film pattern of the present invention, a polysilane layer is firstly formed on a suitable substrate. Regarding the substrate, its shape and material are not specifically limited. Glass plate, metal plate, plastic plate, etc. can be used according to the application.

The polysilane layer is formed on such a substrate. A formation method may be any one which can forms a polysilane layer having an uniform thickness and is not specifically limited. A spin-coating method is normally used.

The organic solvent used in the step of forming the polysilane layer may be any solvent which can dissolve polysilane and is not specifically limited. Toluene is suitably used in this method. It is preferred that the dry film thickness of the polysilane layer is within a range from 0.1 to 10 $\mu$m.

Figure 1A:
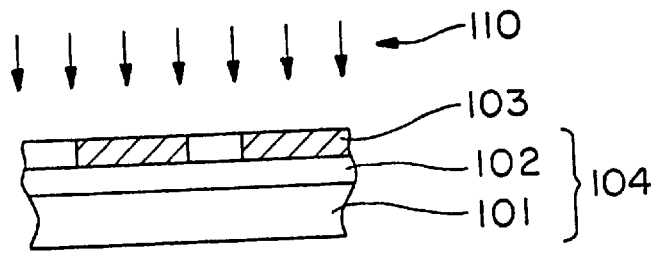
FIGS. 1(a), (b), (c) and (d) are schematic diagrams illustrating one embodiment of the steps of forming a thin film pattern of the present invention.

One embodiment of the steps of forming a thin film pattern is shown in FIGS. 1(a) to (d). As shown in FIG. 1(a), ultraviolet light is irradiated to a laminate 104 for forming a pattern thin film comprising a substrate 101 and a polysilane layer 102 thus obtained, using an ultraviolet light source such as mercury vapor lamp according to the pattern. Ultraviolet light 110 is irradiated through a pattern mask 103 put on the laminate 104 for forming the thin film.

Ultraviolet light used in the present invention has a wavelength of 250 to 400 nm as σ–σ' absorption range of polysilane. Preferably, irradiation may be conducted at a light energy of 0.5 to 10 J/cm$^2$ per 1 $\mu$m in thickness of the polysilane layer.

A Si—Si bond which exists in the polysilane layer is decomposed by ultraviolet light irradiation to form Si—OH (silanol group). Accordingly, a latent image containing a silanol group is formed in the irradiated laminate for forming thin film according to the pattern.

Then, by dipping the laminate for forming the thin film in which the latent image containing a silanol group was formed in a metal oxide sol solution, a sol was absorbed at the pattern part of the laminate for forming the thin film. In order to increase an absorption rate by swelling the polysilane layer, water-soluble organic solvents such as acetonitrile, dioxane, tetrahydrofuran, etc. may be added to the metal oxide sol, if necessary, Such a water-soluble organic solvent may be formulated in the sol solution in an amount of 1 to 30% by weight. When the amount of the solvent exceeds 30% by weight, partial redissolution of the polysilane layer occurs to cause turbulence on the surface of the resulting thin film. In the present invention, absorption of the sol is suitably conducted by dipping a thin film-forming material in the sol solution maintained at 20° to 40° C. for 1 to 40 minutes.

As the material of the metal oxide sol, there can be normally used materials used in the sol-gel processing. The kind of the metal varies depending on the objective function, but examples of the material include metal organic substances (e.g. alkoxide, acetylacetonate, acetate, amine, etc.), soluble inorganic salts (e.g. nitrate, etc.) or dispersants of fine oxide particles of metals (e.g. Si, Zr, Pb, Ti, Ba, Sr, Nb, K, Li, Ta, In, Sn, Zn, Y, Cu, Ca, Mn, Fe, Co, La, Al, Mg, V, etc.). These are dissolved in a solvent such as alcohol to prepare a solution, which is solated by subjecting to the condensation polymerization reaction using a catalyst such as acid or base. Further, all substituents of the metal may not be converted into a condensation-polymerizable functional group, but a part of an organic functional group may remain. Further, materials which can dissolve or disperse in the sol solution may be added.

When using alkoxide of Si, tetraethoxysilane is hydrolyzed and condensed with dehydrating by dissolving it in a mixed solution of ethanol and water and adding hydrochloric acid to the mixture, followed by stirring at room temperature for 2 hours to give a homogeneous silica sol.

Regarding the composition of the silica sol, it is preferably composed of 50 to 200 parts by weight of ethanol, 1 to 200 parts by weight of water and 0.1 to 3 parts by weight of hydrochloric acid, based on 100 parts by weight of tetraethoxysilane. If necessary, water-soluble organic solvents such as acetonitrile, dioxane, tetrahydrofuran, etc. may be further added.

It is believed that the metal oxide sol is absorbed at the ultraviolet light-irradiated part of the polysilane layer and incorporated into the interior of the polysilane layer. It is considered that absorption proceeds into the interior through a fine hole which exists in the ultraviolet light-irradiated part of the polysilane layer. The diameter of sol particles is several nm to about sixty nm and they can be sticked with diffusing. It was confirmed that a particulate material having a suitable size which coexists with sol particles can be diffused together with sol particles into the interior, similar to the case that sol particles exist alone.

Accordingly, when developing a function by absorption of sol particles, there can be given the following cases:

(1) sol particles themselves contain a functional group;

(2) a particulate material, which can be absorbed in the polysilane layer together with sol particles, coexists;

(3) a compound or a polymeric material, which can dissolve in the sol, coexists; and (4) sol particles themselves are absorbed at the ultraviolet light-irradiated part of the polysilane layer and the non-absorbed part is removed to form an irregular surface shape, thereby developing a function.

As a matter of course, two or more sorts of them may be used in combination to develop a function.

Examples of the functional group include fluorine and the like. Water repellency due to fluorine can be imparted to the polysilane layer by forming a sol containing a lot of fluorine atoms and absorbing the sol on the polysilane layer. Further examples of the functional group used in such the method include hydrophobic groups (e.g. alkyl group, etc.), ion-exchange groups (e.g. carboxyl group, sulfo group, acidic hydroxyl group, amino group, etc) and the like.

Examples of the particulate material include copper and silver particles. By preparing a sol in which these particulate materials coexist and absorbing the sol and sol particles in the polysilane layer, copper and silver can be contained in the polysilane layer as the pattern.

When using a silica sol, the particulate material may be dispersed using the silica sol, or the particulate material may be once dispersed using a nonionic surfactant and then mixed when the silica sol is prepared. In this case, it is necessary to adjust the particle size of the particulate material to not more than 500 nm, preferably not more than 200 nm. When the particle size exceeds 500 nm, particles can not be diffused into the ultraviolet light-irradiated part of polysilane even if they are dipped in the sol solution and, therefore, they can not be sticked. The particle size can be measured by a normal centrifugal sedimentation method. It is considered that silica sol particles are adsorbed on the surface of the particulate material. Adsorption of the silica sol on the surface of particles can be easily confirmed by measuring a zeta potential. For example, the zeta potential of the material which was dispersed using the nonionic surfactant becomes stable at −5 to −25 mV because the silanol group came into existence on the surface by absorption of the silica sol.

The material which can dissolve in the sol solution may be any material which dissolves in water or alcohol and which interacts with the silanol group of the silica sol, and it can be diffused into the ultraviolet light-irradiated part of the polysilane layer together with sol particles and sticked. Suitable examples of the polymeric material include polymers containing an alcoholic hydroxyl group (e.g. polyvinyl alcohol, polyethylene glycol, cellulose, etc.), polymers containing an amide group (e.g. poly(2-methyl-2-oxazoline), poly(N-vinylpyrrolidone), poly(N,N-dimethylacrylamide), etc.) and the like. It is possible to impart a function such as flexibility by formulating the above material in the polysilane layer and gelating at a low temperature at which the material is not decomposed. Further, it is possible to impart a function such as porosity by gelating at the temperature higher than the temperature at which the material is decomposed and utilizing holes obtained after the material was deomposed. It is preferred that the above function is a function other than a function of which the object is to obtain coloring. Therefore, a pigment or a dye may be eliminated from the functional material.

The laminate for forming thin film in which a sol was absorbed at the pattern part is dried after the sol solution was removed. As a method of removing the sol solution, there can be used a method of washing with water or a method of blowing off by an air blow.

In order to further promote gelation of sol particles absorbed at the exposed part of the polysilane layer, drying is conducted at not less than 100° C. for 30 minutes to 2 hours. The higher the drying temperature within a permitted range of the substrate and the functional material contained in the sol solution, the more hard membrane having excellent resistance can be obtained. When using a glass substrate and using a silica sol as the sol, an organic substituent is eliminated by heating at not less than 400° C. to give a metal oxide thin film.

Figure 1B:

By a thin film pattern-forming step, as shown in FIG. 1(b), a laminate 104' for forming a thin film having a desired pattern is formed.

Figure 1C:
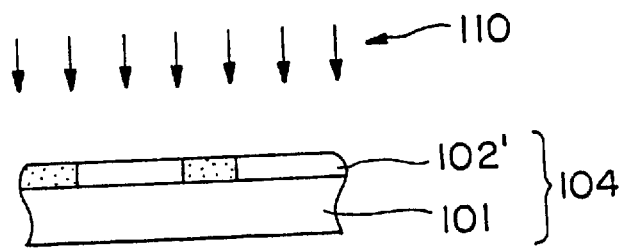
Figure 1D:

When it is necessary to form irregularity on the glass surface as a pre-groove of an optical disc substrate, an irregular pattern thin film as shown in FIG. 1 (d) can be obtained by exposing the total surface to ultraviolet light as shown in FIG. 1(c) and decomposing the residual polysilane layer to remove it. As a method of removing an unnecessary polysilane layer, there can be used a method of volatilizing by heating and a method of removing with a solvent. When the polysilane layer is removed by heating, it is sufficient to heat at not less than 200° C. for 10 to 60 minutes. In this case, sol particles may have no functional characteristics.

Further, a thin film having a different function can be easily patterned on the same substrate by changing the part to be exposed to ultraviolet light and repeating the steps of FIGS.1(a) and (b) using a sol solution of a different formulation.

By such a simple operation, a patterning which was a large problem in the thin film-forming technique by means of the sol-gel processing can be solved.

As described above, a photolithography step using a resist which is necessary for patterning is not required in the method for forming a thin film pattern of the present invention. Further, a pattern thin film formed by this method can be selected according to the required function because it can form a flat layer having no irregularity unless the polysilane layer of the non-exposed part is removed, or it can form a pattern thin film having irregularity if the polysilane layer of the non-exposed part is removed.

Further, the patterning can form a fine pattern thin film having resolution of "submicron order" because of high resolution of photocomposition of the polysilane layer, so that, it is suitable for processing of the irregular surface having high density in comparison with a stamper method.

The applicable area of this technique is wide and a thin film patterning having various functions can be made by selecting the kind of the substrate and material of sol.

EXAMPLE

The following Preparation Examples, Examples and Comparative Examples further illustrate the present invention in detail but are not to be construed to limit the scope thereof. In the Examples and Comparative Examples, all "%s'" are by weight unless otherwise stated.

[Preparation Example 1]

Preparation of Polysilane

To a 1000 ml flask equipped with a stirrer, 400 ml of toluene and 13.3 g of sodium were charged. After sodium was finely dispersed in toluene by vigorous stirring, 51.6 g of phenylmethyldichlorosilane was added. Then, the content of the flask was polymerized by heating to 111° C. in a yellow room where ultraviolet light was cut-off and stirring the mixture for 5 hours. Thereafter, an excessive amount of sodium was deactivated by adding ethanol to the resulting reaction mixture and the mixture was washed with water to separate an organic layer. The organic layer was introduced into ethanol to precipitate polysilane. The resulting crude polyphenylmethylsilane was recrystallized three times in ethanol to give polyphenylmethylsilane having a weight-average molecular weight of 200,000.

[Preparation Example 2]

Preparation of Fluorine Silica Sol

In a 50 ml sample tube, 1.0 g of diethoxytrifluoromethylmethylsilane, 4.0 g of tetraethoxysilane, 7.7 g of ethanol and 4.9 g of deionized water were mixed and 0.06 g of concentrated hydrochloric acid was added with stirring, and the mixture was continued to stir at room temperature for 2 hours. To the resulting silica sol solution, 15.4 g of deionized water and 3.9 g of acetonitrile were added to give a fluorine silica sol solution.

[Preparation Example 3]

Preparation of Silica Sol

13 G of tetraethoxysilane, 20 g of ethanol and 13 g of water were charged in a beaker and 0.1 g of concentrated hydrochloric acid was added with stirring, and the mixture was stirred at 30° C. for 2 hours, hydrolyzed and condensed with dehydrating to prepare a sol, to which were further added 43 g of water and 10 g of acetonitrile to give a silica sol for dipping.

[Preparation Example 4]

Preparation of Titanium-containing Sol

10 G of tetrapropoxy titanium, 3 g of tetraethoxysilane, 20 g of ethanol and 13 g of water were charged in a beaker and 0.1 g of concentrated hydrochloric acid was added with stirring, and the mixture was stirred at 30° C. for 2 hours, hydrolyzed and condensed with dehydrating to prepare a sol. To which were further added 43 g of water and 10 g of acetonitrile to give a titanium-containing sol for dipping.

[Preparation Example 5]

Preparation of Silver Particles-containing Silica Sol

10 G of silver powder (325 mesh, manufactured by Wako Pure Chemical Industries, Ltd.), 13 g of tetraethoxysilane, 20 g of ethanol, 13 g of water and 0.1 g of concentrated hydrochloric acid were charged in a vessel for sand mill and 50 g of zircon beads were further added, and the mixture was subjected to sand mill dispersion at 3000 revolutions per minute at 30° C. for 6 hours. To 50 g of the resulting paste dispersion, 40 g of water and 10 g of acetonitrile were further added to give a silver fine particles-containing silica sol for dipping.

A particle size of this paste dispersion was measured using a (centrifugal sedimentation method) particle size measuring equipment (CAPA-700, manufactured by Horiba, Ltd.). As a result, the average particle size was 150 nm.

[Preparation Example 6]

Preparation of Organic Polymer-containing Silica Sol

5 G of polyethylene glycol 6000 having an average molecular weight of 6000 (manufactured by Wako Pure Chemical industries, Ltd.) 13 g of tetraethoxysilane, 20 g of ethanol and 13 g of water were charged in a beaker and 0.1 g of concentrated hydrochloric acid was added with stirring, and the mixture was stirred at 30° C. for 2 hours to prepare a sol, to which were further added 38 g of water and 10 g of acetonitrile to give a polyethylene glycol-containing silica sol for dipping.

[Preparation Example 7]

Preparation of Silver Particles-containing Silica Sol

10 G of silver powder (325 mesh, manufactured by Wako Pure Chemical Industries, Ltd.), 13 g of tetraethoxysilane, 20 g of ethanol, 13 g of water and 0.1 g of concentrated hydrochloric acid were charged in a vessel for sand mill and 50 g of zircon beads were further added, and the mixture was subjected to sand mill dispersion at 3000 revolutions per minute at 30° C. for one hour. A particle size of this paste dispersion was measured using a (centrifugal sedimentation method) particle size measuring equipment (CAPA-700, manufactured by Horiba, Ltd.). As a result, the average particle size was 700 nm. To 50 g of the paste dispersion, 40 g of water and 10 g of acetonitrile were further added to give a silver fine particles-containing silica sol for dipping.

[Example 1]

A 10% toluene solution of polysilane obtained in Preparation Example 1 was applied on a glass substrate (5 cm×5 cm×0.11 cm in thickness) using a spin coater ("PRS-14", manufactured by Dynapart Co.) so that the dry film thickness may become 2 μm. A quartz photomask was put on the resulting laminate for forming thin film pattern which was exposed to ultraviolet light at a light energy of 4 J/cm² using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 2 for 5 minutes. After dipping, the laminate was washed with water and dried at 200° C. for 30 minutes to give a pattern thin film of a fluorine silica gel.

A surface contact angle of this fluorine silica gel to the thin film pattern part was measured using a contact angle measuring equipment (CA-Z type, manufactured by Kyowa Kaimen Kagaku Co., Ltd.). As a result, it was 96°. Further, a contact angle of the non-exposed part of the polysilane layer was measured. As a result, it was 90°. Further, ultraviolet light was irradiated on this laminate for forming thin film pattern at a light energy of 4 J/cm² using the above equipment and the laminate was dried at 160° C. for 30 minutes. As a result, the contact angle of the pattern part of the fluorine silica gel became 98°, but the contact angle of the non-sticked part of the gel thin film was further decreased to 80°. Aqueous ink for flexography (Aqua PAC92 India ink, manufactured by Toyo Ink Co., Ltd.) was applied on this laminate for forming thin film pattern. As a result, the pattern part in which the fluorine silica gel thin film was formed repelled ink. Thus, it is possible to forms a pattern of a thin film having surface water repellency.

[Example 2]

A 10% toluene solution of polysilane obtained in Preparation Example 1 was applied on a glass substrate (5 cm×5 cm×0.11 cm in thickness) using a spin coater ("PRS-14", manufactured by Dynapart Co.) so that the dry film thickness may become 2 μm. A quartz photomask was put on the resulting laminate for forming thin film pattern which was exposed to ultraviolet light at a light energy of 4 J/cm² using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 3 for 5 minutes. After dipping, the laminate was washed with water and dried at 200° C. for 30 minutes to give a pattern thin film of a silica gel.

Further, ultraviolet light was irradiated on the total surface of this laminate for forming thin film pattern at a light energy of 4 J/cm² using the above equipment and the laminate was dried at 200° C. for 30 minutes. As a result, the polysilane layer other than the pattern thin film of the silica gel was volatilized to form an irregular pattern of the thin film of the silica gel on the glass substrate. Further, the irregular pattern was completely changed into a glass of silicon oxide by calcinating at 600° C. for 30 minutes. The profile of irregularity was measured using a surface shape measuring equipment (Dektak 3ST, manufactured by ULVAC Co., Ltd.). As a result, it was found that a pre-groove of 0.5 μm in height is formed. Thus, it is possible to form fine irregularity on the glass surface without using a stamper method or etching method.

[Example 3]

A 10% toluene solution of polysilane obtained in Preparation Example 1 was applied on a glass substrate provided with an ITO conductive film (5 cm×5 cm×0.11 cm in thickness) using a spin coater ("PRS-14", manufactured by Dynapart Co.) so that the dry film thickness may become 1 µm. A quartz photomask was put on the resulting laminate for forming thin film pattern which was exposed to ultraviolet light at a light energy of 2 J/cm² using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 3 for 5 minutes. After dipping, the laminate was washed with water and dried at 200° C. for 30 minutes to give a pattern thin film of a silica gel.

Further, ultraviolet light was irradiated on the total surface of this laminate for forming thin film pattern at a light energy of 2 J/cm² using the above equipment and the laminate was dried at 200° C. for 30 minutes. As a result, the polysilane layer other than the pattern thin film of the silica gel was volatilized to form an irregular pattern of the thin film of the silica gel on the glass substrate. Further, the irregular pattern was completely changed into a glass of silicon oxide by calcinating at 600° C. for 30 minutes to form a pattern of an insulation film of 0.2 µm in thickness on the ITO film. A resistance value of this insulation film was measured. As a result, the film had a volume resistance value of $10^{15}$ Ω·cm. Thus, it is possible to form a pattern of a transparent insulation film on a transparent electrode by a simple method.

[Example 4]

A 10% toluene solution of polysilane obtained in Preparation Example 1 was applied on a quartz glass substrate (5 cm×5 cm×0.11 cm in thickness) using a spin coater ("PRS-14", manufactured by Dynapart Co.) so that the dry film thickness may become 1 µm. A quartz photomask was put on the resulting laminate for forming thin film pattern which was exposed to ultraviolet light at a light energy of 2 J/cm² using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 4 for 5 minutes. After dipping, the laminate was washed with water and dried at 200° C. for 30 minutes to give a pattern thin film of a silica titania gel.

Further, ultraviolet light was irradiated on the total surface of this laminate for forming thin film pattern at a light energy of 2 J/cm² using the above equipment and the laminate was dried at 200° C. for 30 minutes. As a result, the polysilane layer other than the pattern thin film of the silica titania gel was volatilized to form an irregular pattern of the thin film of the silica gel on the glass substrate. Further, the irregular pattern was completely changed into a glass of silicon oxide titanium oxide by calcinating at 500° C. for 30 minutes. An UV spectrum of the pattern part of this titanium oxide was measured using a microscopic spectrophotometer (MCPD-1000, manufactured by Otsuka Electronics Co., Ltd.). As a result, absorption of the ultraviolet part was observed. Thus, it is possible to form a pattern of a film of cutting-off ultraviolet light by a simple method.

[Example 5]

A 15% toluene solution of polysilane obtained in Preparation Example 1 was applied on a glass substrate (5 cm×5 cm×0.11 cm in thickness) using a spin coater ("PRS-14", manufactured by Dynapart Co.) so that the dry film thickness may become 5 µm. A quartz photomask was put on the resulting laminate for forming thin film pattern which was exposed to ultraviolet light at a light energy of 10 J/cm² using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 5 for 5 minutes. After dipping, the laminate was washed with water and calcinated at 600° C. for 30 minutes to give a conductive pattern thin film of silicon oxide containing silver particles. A resistance value of this conductive film was measured. As a result, the film had a volume resistance value of $10^{-2}$ Ω·cm. Thus, it is possible to form a pattern of a conductive thin film on an insulation substrate by a simple method.

[Comparative Example 1]

A 15% toluene solution of polysilane obtained in Preparation Example 1 was applied on a glass substrate (5 cm×5 cm×0.11 cm in thickness) using a spin coater ("PRS-14", manufactured by Dynapart Co.) so that the dry film thickness may become 5 µm. A quartz photomask was put on the resulting laminate for forming thin film pattern which was exposed to ultraviolet light having at a light energy of 10 J/cm² using an ultra-high pressure mercury lamp parallel exposure equipment (CL-50-200A, manufactured by Japan Storage Battery Co., Ltd.). After the photomask was removed, the laminate on which a latent image was formed was dipped in a sol obtained in Preparation Example 7 for 5 minutes. After dipping, the laminate was washed with water and calcinated at 600° C. for 30 minutes. However, no sticking of silver particles was observed. Thus, sticking of particles having a particle size of more than 500 nm can not be conducted because the polysilane layer can not be diffused into the ultraviolet light-irradiated part of the polysilane layer.

[Example 6]

A 15% toluene solution of polysilane obtained in Preparation Example 1 was applied on a glass substrate (5 cm×5 cm×0.11 cm in thickness) using a spin coater ("PRS-14", manufactured by Dynapart Co.) so that the dry film thickness may become 5 µm. A quartz photomask was put on the resulting laminate for forming thin film pattern which was exposed to ultraviolet light at a light energy of 10 J/cm² using an ultra-high pressure mercury lamp parallel exposure equipment (CL-50-200A, manufactured by Japan Storage Battery.). After the photomask was removed, the laminate on which a latent image was formed was dipped in a sol obtained in Preparation Example 6 for 5 minutes. After dipping, the laminate was washed with water and dried at 200° C. for 30 minutes to give a pattern thin film of a silica gel containing polyethylene glycol. Further, this pattern thin film was completely decomposed by calcinating at 600° C. for one hour to give a porous body having fine pores. The porosity distribution of this porous body was calculated by a nitrogen gas method. As a result, the porous body had a pore of about 20 Å in diameter. Thus, it is possible to form a pattern of a porous thin film by a simple method.

A function of thin film patterns of Examples 1 to 6 is shown in Table 1, respectively.

TABLE 1

| Example No. | Composition of sol | Function |
|---|---|---|
| 1 | Fluorine group-containing silica sol | Water-repellent thin film patterning |
| 2 | Silica sol | Fine irregular processing |
| 3 | Silica sol | Insulation thin film patterning |
| 4 | Titania/silica sol | Ultraviolet light cut-off thin film patterning |
| 5 | Fine silver particles + silica sol | Conductive thin film patterning |
| 6 | Polyethylene glycol + silica sol | Porous thin film patterning |

What is claimed is:

1. A method for forming a thin film pattern, which comprises the steps of:

(a) selectively exposing a polysilane layer formed on a substrate from a polysilane having a structure of the formula:

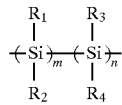

wherein $R_1$, $R_2$, $R_3$ and $R_4$ indicate a group which is independently selected from the group consisting of a substituted or non-substituted aliphatic hydrocarbon residue, an alicyclic hydrocarbon residue and an aromatic hydrocarbon residue and m and n indicate an integer, provided on a substrate, to ultraviolet light to form a latent image of the thin film pattern; and (b) dipping the polysilane layer in which the latent image of the thin film pattern is formed in a metal oxide sol and then drying, said method being conducted in the absence of a pigment and a dye, (i) wherein said metal oxide sol is selected so that the thin film pattern which is obtained has a water-repellent property, electroconductive property or porous property, or eventually, (ii) the obtained thin film pattern is further treated so as to obtain an irregular property, insulating property or ultraviolet light cut-off property.

2. The method according to claim 1, wherein the metal oxide sol itself contains a functional group.

3. The method according to claim 1, wherein the metal oxide sol further contains a particulate material.

4. The method according to claim 1, wherein the metal oxide sol further contains a compound or a polymeric material which dissolves in a sol.

5. The method according to claim 1, further comprising the step of removing a non-exposed part of the polysilane layer, after the thin film pattern is formed.

6. A water-repellent thin film patterned by the method of claim 1.

7. A fine irregular thin film or insulation thin film obtained by the method of claim 1, wherein the sol is a silica sol.

8. An ultraviolet light cut-off thin film patterned by the method of claim 1, wherein the sol is a silica sol containing titania.

9. An electroconductive thin film patterned by the method of claim 1, wherein the sol is a silica sol containing silver particles.

10. A porous thin film patterned by the method of claim 1, wherein the sol is a silica sol containing polyethylene glycol.

* * * * *